(12) United States Patent
Chen et al.

(10) Patent No.: US 11,715,655 B1
(45) Date of Patent: Aug. 1, 2023

(54) FLEXURE-BASED CONTINUOUS EJECTOR PIN MECHANISM FOR MINI/MICRO CHIP MASS TRANSFER

(71) Applicant: GUANGDONG UNIVERSITY OF TECHNOLOGY, Guangzhou (CN)

(72) Inventors: Xin Chen, Guangzhou (CN); Zhihang Lin, Guangzhou (CN); Hui Tang, Guangzhou (CN); Hongcheng Li, Guangzhou (CN); Jian Gao, Guangzhou (CN); Qiang Liu, Guangzhou (CN); Xun Chen, Guangzhou (CN)

(73) Assignee: GUANGDONG UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 18/062,025

(22) Filed: Dec. 6, 2022

(30) Foreign Application Priority Data

Feb. 18, 2022 (CN) .......................... 202210152777.4

(51) Int. Cl.
*H01L 21/67* (2006.01)
*H01L 33/00* (2010.01)

(52) U.S. Cl.
CPC .... *H01L 21/67144* (2013.01); *H01L 33/0093* (2020.05)

(58) Field of Classification Search
CPC ............. H01L 21/67144; H01L 33/0093
USPC .......................................................... 414/751
See application file for complete search history.

(56) References Cited

U.S. PATENT DOCUMENTS

| | | | | |
|---|---|---|---|---|
| 3,957,185 A | * | 5/1976 | Kauffman | H01L 21/67144 228/6.2 |
| 4,798,989 A | * | 1/1989 | Miyazaki | H01J 37/28 250/311 |
| 4,896,811 A | * | 1/1990 | Dunn | H01L 21/67138 228/5.5 |
| 5,297,130 A | * | 3/1994 | Tagawa | G01Q 10/04 310/317 |

(Continued)

FOREIGN PATENT DOCUMENTS

| | | |
|---|---|---|
| CN | 111916374 A | 11/2020 |
| CN | 112563395 A | 3/2021 |

(Continued)

*Primary Examiner* — Vu A Vu
(74) *Attorney, Agent, or Firm* — True Shepherd LLC; Andrew C. Cheng

(57) ABSTRACT

A flexure-based continuous ejector pin mechanism for Mini/Micro chip mass transfer includes a first drive frame, a second drive frame, a mounting base, a first thorn die attach drive device, a second thorn die attach drive device, first flexible hinges, second flexible hinges, and a pricking pin. The second drive frame and the first drive frame are connected through the first flexible hinge. The mounting base is connected to a left side and a right side of the second drive frame through the second flexible hinges. Compared with a laser transfer technology, the flexible movable thorn die attach device has lower cost and higher accuracy; compared with a vacuum nozzle transfer technology, the flexible movable thorn die attach device has higher transfer efficiency and quality; and compared with a conventional thorn die attach device, the flexible movable thorn die attach device has higher transfer efficiency and precision.

10 Claims, 4 Drawing Sheets

(56) References Cited

U.S. PATENT DOCUMENTS

| | | | | |
|---|---|---|---|---|
| 5,696,421 | A  * | 12/1997 | Zumeris | H02N 2/108 |
| | | | | 310/366 |
| 6,501,210 | B1 * | 12/2002 | Ueno | B23Q 1/621 |
| 6,825,915 | B2 * | 11/2004 | Yamauchi | G03F 7/707 |
| | | | | 355/72 |
| 8,016,277 | B2 | 9/2011 | Choi et al. | |
| 8,089,638 | B2 * | 1/2012 | Lee | G01B 11/26 |
| | | | | 356/399 |
| 10,239,167 | B2 * | 3/2019 | Yang | B23Q 5/28 |
| 11,088,015 | B2 * | 8/2021 | Halpin | F16D 1/12 |
| 2011/0245964 | A1 * | 10/2011 | Sullivan | H01L 21/68707 |
| | | | | 700/228 |

FOREIGN PATENT DOCUMENTS

| | | |
|---|---|---|
| CN | 113035766 A | 6/2021 |
| CN | 213660378 U | 7/2021 |
| CN | 113937039 A | 1/2022 |
| JP | 2002022867 A | 1/2002 |

* cited by examiner

FLEXURE-BASED CONTINUOUS EJECTOR PIN MECHANISM FOR MINI/MICRO CHIP MASS TRANSFER

CROSS REFERENCE TO RELATED APPLICATION

This application claims priority to the Chinese Patent Application No. 202210152777.4 with a filing date of Feb. 18, 2022. The content of the aforementioned application, including any intervening amendments thereto, is incorporated herein by reference.

TECHNICAL FIELD

The present disclosure relates to the technical field of Mini/Micro-LED die transfer and packaging, and in particular, to a flexure-based continuous ejector pin mechanism for Mini/Micro chip mass transfer.

BACKGROUND

With continuous development of the chip manufacturing technology, light-emitting diode (LED) chips are developing towards thinning, miniaturization, and arraying. At present, high-end LED chips have fully entered the micron era. The size of Mini-LED chips is between 100 and 300 micrometers, while the minimum size of Micro-LED chips has been reduced to within 50 μm, and the minimum wafer spacing has been reduced to 5-10 μm. How to realize the scaling of chips from wafers to display panels with an equal spacing has become a key technical problem in this field.

The miniaturization of chip size and the large-scale number of chips impose strict requirements on the accuracy and efficiency of transfer and packaging, and the level of accuracy and efficiency directly affects the yield of transfer and packaging. Therefore, the transfer and packaging for micronized chips must require system accuracy to be at the level of several micrometers, and even more stringent for a key core device. To manufacture a panel of the same size, the smaller the dies used, the more dies are needed, which imposes a speed requirement for transfer and packaging methods and systems.

In the prior art, there are mainly the following three technologies for Mini/Micro-LED transfer and packaging:

1. A laser transfer method: the upper and lower motion platforms are configured to mount the die carrier (such as a blue film) and the circuit substrate, respectively. After the die and the substrate are aligned through the detection of a charge coupled device (CCD) and coordinated actions of the motion platforms, the die is separated from the carrier through laser, and freely falls onto the circuit substrate to complete the packaging and transfer. This method has special requirements for the material of the die carrier. For example, the Japanese V-Technology company employs a special material that can generate nitrogen after laser irradiation. Then, the use of laser for packaging and transfer puts forward strict requirements on the power and frequency of the laser. Too high power can easily burn and damage the LED die, and too low power cannot generate enough nitrogen to make the die detach from the substrate. In addition, after the LED die is shot down by the laser, the falling die falls on the circuit substrate by means of free fall, which also requires a vacuum environment and other requirements to reduce a falling error. The material, laser and environmental requirements greatly increase the cost of Mini/Micro-LED chip packaging and transfer.

2. A vacuum nozzle method: in the conventional LED chip packaging equipment, the die and the substrate are separated, and under the cooperation of the CCD, the die is suctioned from the die carrier by a device equipped with a vacuum nozzle on a mechanical swing arm, and is transferred onto the circuit substrate for transferring and packaging. This method is the conventional Pick & Place method, and has low transfer efficiency because each die is picked up and placed down separately, and the overall equipment is larger due to the separated layout. Moreover, the mechanical swing arm is a cantilever beam structure, so there is a large vibration during the transfer and packaging process, greatly limiting the accuracy and speed of transfer and packaging.

3. A mechanical thorn die attach method: the die and the circuit substrate are vertically arranged under the cooperation of the upper and lower platforms, and after the alignment of the die and the substrate is completed through the detection of the CCD and the cooperative operation of the upper and lower motion platforms, the die is pricked off from the die carrier to the circuit substrate through the pricking pin to complete the transfer and packaging. The conventional mechanical thorn die attach method is the same as the laser transfer method. The die carrier and the circuit substrate are arranged vertically. After the alignment is performed by the upper and lower motion platforms, the die is pricked off by the pricking pin to the circuit substrate. The pricking pin of the conventional thorn die attach device only moves up and down. Therefore, if the precise alignment between the die and the substrate is required, the motion platforms need to be intermittently paused and then perform pricking, and then move to wait for the completion of thorn die attach before replacing a next die. Such a technological process greatly limits the transfer speed, and the motion platforms are inevitably started and stopped frequently, which may increase the loss of the motion platforms, and the jitter caused by the start and stop may greatly reduce the precision of packaging.

SUMMARY

In view of the above defects, an objective of the present disclosure is to provide a flexure-based continuous ejector pin mechanism for Mini/Micro chip mass transfer, which can complete Mini/Micro-LED die packaging and transfer operations with high yield and high efficiency.

To achieve the above purpose, the present disclosure provides the following technical solutions:

A flexure-based continuous ejector pin mechanism for Mini/Micro chip mass transfer is provided, including a thorn die attach unit, where the thorn die attach unit includes a first drive frame, a second drive frame, a mounting base, a first thorn die attach drive device, a second thorn die attach drive device, first flexible hinges, second flexible hinges, and a pricking pin; both the first drive frame and the second drive frame are of rectangular frame structures, and are arranged in a coplanar manner; the second drive frame is located on outside the first drive frame, and four vertexes of the second drive frame are connected to the first drive frame along a vertical direction through the first flexible hinges; a left side and a right side of the mounting base are respectively connected to a left side and a right side of the second drive frame along a horizontal direction through the second flexible hinges; the pricking pin is provided at a bottom of the mounting base along the vertical direction, an upper end of the pricking pin is fixedly connected to the bottom of the mounting base, and a lower end of the pricking pin extends below the first drive frame; the first thorn die attach drive device is fixedly mounted on the first drive frame, and a drive end of the first thorn die attach drive device is in transmission connection to the second drive frame, such that the second drive frame can move horizontally under driving of the first thorn die attach drive device; and the second thorn die attach drive device is fixedly mounted on the second drive frame, and a drive end of the second thorn die attach drive device is in transmission connection to the second drive frame, such that the second drive frame can move vertically under driving of the second thorn die attach drive device.

Preferably, the first thorn die attach drive device is fixedly mounted on a left side of the first drive frame, the drive end of the first thorn die attach drive device is arranged horizontally, and a drive direction of the first thorn die attach drive device and the second flexible hinge horizontally connected to the left side of the mounting base are arranged collinearly.

Preferably, the second thorn die attach drive device is fixedly mounted on an upper side of the second drive frame, and a drive direction of the drive end of the second thorn die attach drive device is vertically arranged downward.

Preferably, the four vertexes of the second drive frame are separately hinged to one of the first flexible hinges along the vertical direction; and the left side and the right side of the mounting base are each provided with two of the second flexible hinges for connection.

Preferably, the first thorn die attach drive device and the second thorn die attach drive device are voice coil motors; and the first flexible hinges and the second flexible hinges are sheet structures made of aviation aluminum.

The flexure-based continuous ejector pin mechanism for Mini/Micro chip mass transfer further includes: a portal frame, a first motion platform, a worktable, a second motion platform, and an industrial camera, where the first motion platform is configured to bear a circuit substrate; the worktable is configured to heat and fix welding between an LED die and the circuit substrate; the second motion platform is configured to bear the LED die and move directly above the first motion platform; the industrial camera is configured to detect opposite positions between the circuit substrate and each LED die; the thorn die attach unit is configured to transfer the LED die on the second motion platform to the circuit substrate on the first motion platform; the worktable is arranged on the first motion platform; and the portal frame is mounted directly above the first motion platform; and the industrial camera and the thorn die attach unit are mounted on the portal frame.

Preferably, the flexure-based continuous ejector pin mechanism for Mini/Micro chip mass transfer further includes a controller, where the controller is electrically connected to the first thorn die attach drive device, the second thorn die attach drive device, the first motion platform, the worktable, the second motion platform, and the industrial camera.

Preferably, the LED die is a Mini-LED die or a Micro-LED die.

Preferably, the controller is internally provided with a thorn die attach control method for transferring and packaging LED dies; and the thorn die attach control method includes the following steps:

a loading operation: loading the circuit substrate to the worktable on the first motion platform, loading a die carrier with an LED die to a second transport platform, and moving, by the first motion platform, the circuit substrate into a welding region directly below the thorn die attach unit along an X direction;

an alignment operation: controlling, by the controller, the second motion platform to move along the X direction through detection information of the industrial camera, such that the LED die on the die carrier is aligned with the circuit substrate in the welding region;

a thorn die attach operation: controlling, by the controller, drive conditions of the first motion platform, the second motion platform, the first thorn die attach drive device, and the second thorn die attach drive device to the mounting base, such that the thorn die attach unit pricks off the LED die from the die carrier and transfers the LED die to a specified position on the circuit substrate; and a welding operation: controlling, by the controller, the worktable to heat and weld the LED die and the circuit substrate.

Preferably, the thorn die attach operation specifically includes the following steps:

controlling, by the controller, the first motion platform, the second motion platform, and the thorn die attach unit to move to the X direction at the same speed; and in a process of the thorn die attach unit moving to the X direction, controlling, by the controller, drive of the first thorn die attach drive device, such that the pricking pin reciprocates up and down along the vertical direction relative to the first drive frame at a set speed.

The embodiments of the present disclosure have the following beneficial effects:

Compared with a laser transfer technology, the flexible movable thorn die attach device has lower cost and higher accuracy; compared with a vacuum nozzle transfer technology, the flexible movable thorn die attach device has higher transfer efficiency and quality; and compared with a conventional thorn die attach device, the flexible movable thorn die attach device has higher transfer efficiency and precision by improving a thorn die attach process through relative stillness of a pinhead, a die and a substrate.

Figure 1:
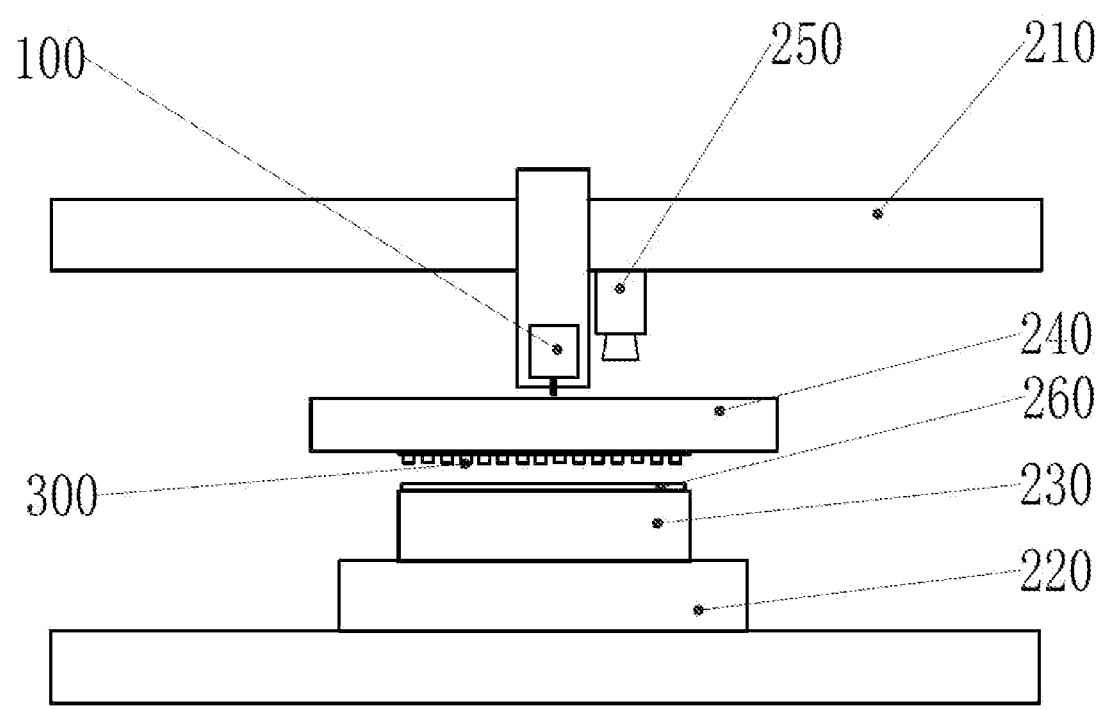
FIG. 1 is a front schematic structural diagram of a flexible movable thorn die attach device according to one embodiment of the present disclosure.
Figure 2:
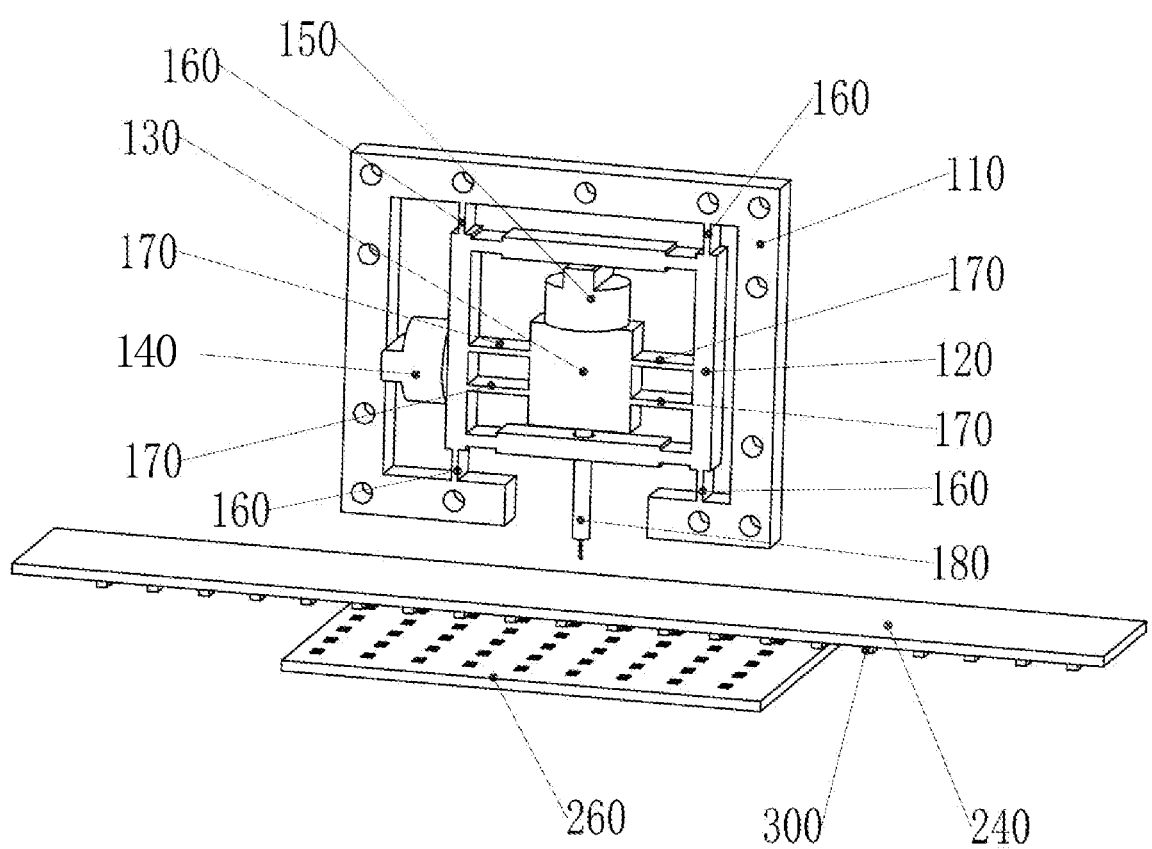
FIG. 2 is a three-dimensional schematic structural diagram of a flexible movable thorn die attach device according to one embodiment of the present disclosure.

100-thorn die attach unit, 110-first drive frame, 120-second drive frame, 130-mounting base, 140-first thorn die attach drive device, 150-second thorn die attach drive device, 160-first flexible hinge, 170-second flexible hinge, 180-pricking pin, 210-portal frame, 220-first motion platform, 230-worktable, 240-second motion platform, 250-industrial camera, 260-circuit substrate, and 300-LED die.

DETAILED DESCRIPTION OF THE EMBODIMENTS

The technical solutions of the present disclosure will be described in more detail below with reference to the accompanying drawings and specific implementations.

According to one embodiment of the present disclosure, as shown in FIG. 1 to FIG. 4, the flexure-based continuous ejector pin mechanism for Mini/Micro chip mass transfer includes a portal frame 210, a first motion platform 220, a worktable 230, a second motion platform 240, an industrial camera 250, and a thorn die attach unit 100. The first motion platform is configured to bear a circuit substrate 260. The worktable 230 is configured to heat and fix welding between an LED die 300 and the circuit substrate 260. The second motion platform 240 is configured to bear the LED die 300, and move directly above the first motion platform 220. The industrial camera 250 is configured to detect opposite positions between the circuit substrate 260 and each LED die 300. The thorn die attach unit 100 is configured to transfer the LED die 300 on the second motion platform 240 to the circuit substrate 260 on the first motion platform 220. The worktable 230 is arranged on the first motion platform 220. The portal frame 210 is mounted directly above the first motion platform 220. The industrial camera 250 and the thorn die attach unit 100 are mounted on the portal frame 210.

The thorn die attach unit 100 includes a first drive frame 110, a second drive frame 120, a mounting base 130, a first thorn die attach drive device 140, a second thorn die attach drive device 150, first flexible hinges 160, second flexible hinges 170, and a pricking pin 180. Both the first drive frame 110 and the second drive frame 120 are of rectangular frame structures, and are arranged in a coplanar manner. The second drive frame 120 is located outside the first drive frame 110, and four vertexes of the second drive frame 120 are connected to the first drive frame along a vertical direction through the first flexible hinges 160. A left side and a right side of the mounting base 130 are respectively connected to a left side and a right side of the second drive frame 120 along the horizontal direction through the second flexible hinges 170. The pricking pin 180 is provided at a bottom of the mounting base 130 along the vertical direction, an upper end of the pricking pin 180 is fixedly connected to the bottom of the mounting base 130, and a lower end of the pricking pin 180 extends below the first drive frame 110. The first thorn die attach drive device 140 is fixedly mounted on the first drive frame 110, and a drive end of the first thorn die attach drive device 140 is in transmission connection to the second drive frame 120, such that the second drive frame 120 can move horizontally under driving of the first thorn die attach drive device 140. The second thorn die attach drive device 150 is fixedly mounted on the second drive frame 120, and a drive end of the second thorn die attach drive device 150 is in transmission connection to the second drive frame 120, such that the second drive frame 120 can move vertically under driving of the second thorn die attach drive device 150.

The first drive frame 110, the second drive frame 120, and the mounting base 130 are connected through the flexible hinges. The first thorn die attach drive device 140 can drive the second drive frame 120 to move in the horizontal direction relative to the first drive frame 110. The second thorn die attach drive device 150 can drive the mounting base 130 to move in the vertical direction relative to the second drive frame 120. In a thorn die attach operation of the LED die 300, the movement of the pricking pin 180 in the horizontal and vertical directions is subtle and precise. The above structures of the thorn die attach unit 100 can ensure that the pricking pin 180 moves accurately according to a drive instruction in the frame structures, and can quickly restore to an initial stable suspension state.

Specifically, the first thorn die attach drive device 140 is fixedly mounted on the left side of the first drive frame 110, the drive end of the first thorn die attach drive device 140 is arranged horizontally, and the drive direction of the first thorn die attach drive device 140 and the second flexible hinge 170 horizontally connected to the left side of the mounting base 130 are arranged collinearly. The second thorn die attach drive device 150 is fixedly mounted on the upper side of the second drive frame 120, and the drive direction of the drive end of the second thorn die attach drive device 150 is vertically arranged downward, such that the drive response speed of the thorn die attach unit 100 is faster, and the thorn die attach operation of the LED die 300 is more efficient.

Four vertexes of the second drive frame 120 are separately hinged to one of the first flexible hinges 160 along the vertical direction. The left side and the right side of the mounting base 130 are separately provided with two of the second flexible hinges 170 for connection. The second drive frame 120 can have better drive sensitivity in the horizontal direction, and the mounting base 130 has a better support suspension structure and drive accuracy in the vertical direction.

The first thorn die attach drive device 140 and the second thorn die attach drive device 150 are voice coil motors; and the first flexible hinges 160 and the second flexible hinges 170 are sheet structures made of aviation aluminum. Specifically, to ensure that the first flexible hinges 160 and the second flexible hinges 170 have a stable support structure for the mounting base 130 and higher drive sensitivity, the thickness of the sheet structures is preferably within 1-2 mm, and the width of the middles of the sheet structures is smaller than those of both ends. The drive frame, the second drive frame 120, the mounting base 130, the first flexible hinges 160, the second flexible hinges 170, and the mounting base 130 are of an integrally formed structure made of the aviation aluminum.

The flexible movable thorn die attach device further includes a controller. The controller is electrically connected to the first thorn die attach drive device 140, the second thorn die attach drive device 150, the first motion platform 220, the worktable 230, the second motion platform 240, and the industrial camera 250.

The LED die 300 is a Mini-LED die 300 or a Micro-LED die 300.

The controller is internally provided with a thorn die attach control method for transferring and packaging the LED die 300. The thorn die attach control method includes the following steps:

a loading operation: load the circuit substrate 260 to the worktable 230 on the first motion platform 220, load a die carrier with an LED die 300 to a second transport platform, and move, by the first motion platform 220, the circuit substrate 260 into a welding region directly below the thorn die attach unit 100 along an X direction;

an alignment operation: control, by the controller, the second motion platform 240 to move along the X direction through detection information of the industrial camera 250, such that the LED die 300 on the die carrier is aligned with the circuit substrate 260 in the welding region;

a thorn die attach operation: control, by the controller, drive conditions of the first motion platform 220, the second motion platform 240, the first thorn die attach drive device 140, and the second thorn die attach drive device 150 to the mounting base 130, such that the thorn die attach unit 100 pricks off the LED die 300 from the die carrier and transfers to a specified position on the circuit substrate 260; and a welding operation: control, by the controller, the worktable 230 to heat and weld the LED die 300 and the circuit substrate 260.

Figure 3:
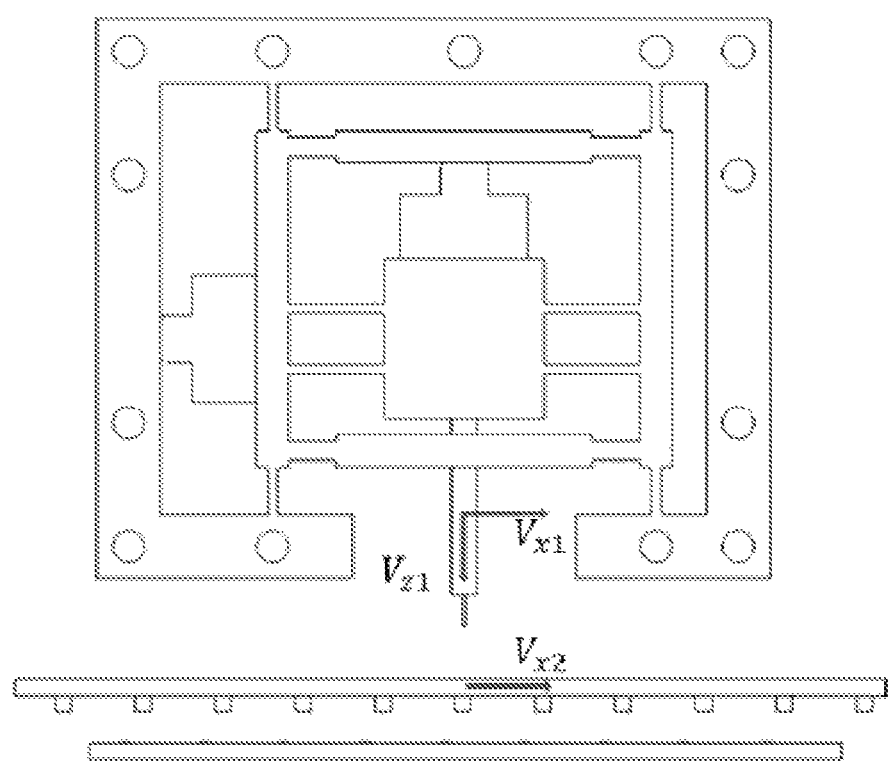
FIG. 3 is a schematic setting diagram of a moving speed of a pricking pin according to one embodiment of the present disclosure.
Figure 4:
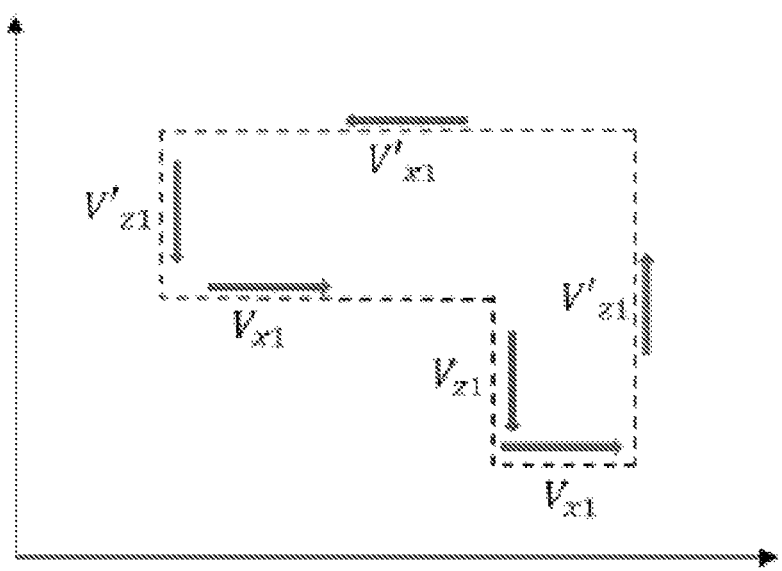
FIG. 4 is a schematic diagram of a moving trajectory of a pricking pin according to one embodiment of the present disclosure.

As shown in FIG. 3 and FIG. 4, the thorn die attach operation specifically includes the following steps:

control, by the controller, the first motion platform 220, the second motion platform 240, and the thorn die attach unit 100 to move to the X direction at the same speed; and in a process of the thorn die attach unit 100 moving to the X direction, control, by the controller, drive of the first thorn die attach drive device 140, such that the pricking pin 180 reciprocates up and down along the vertical direction relative to the first drive frame 110 at a set speed.

Specifically, in the thorn die attach stage, the speed of the first motion platform 220 and the second motion platform 240 moving to the X direction is set as $V_{x2}$; the speed of the pricking pin 180 moving to the X direction during descending is $V_{x1}$, and the speed of the pricking pin 180 moving to the X direction during ascending is $V'_{x1}$; the process that the pricking pin 180 does not touch the LED die 300 during ascending and descending in a Z direction is a Z-direction movement process, the speed of moving along the Z direction in the Z-direction movement process is $V'_{z1}$, the speed of the pricking pin 180 moving along the Z direction when contacting the LED die 300 is $V_{z1}$, and $V'_{z1} \gg V_{z1}$, $V'_{x1} \gg V_{x1}$. The above refined control of the moving speed of the pricking pin 180 in the X direction and the Z direction can make the pricking needle 180 return to the same initial position after completing the thorn die attach operation of the previous LED die 300 each time, such that the thorn die attach operation of the LED die 300 is more efficient and precise.

The flexible movable thorn die attach device can implement non-intermittent movement of the motion platforms and thorn die attach during the thorn die attach operation of the LED die 300, to ensure higher speed and accuracy in the packaging alignment of the LED die 300. The flexible movable thorn die attach device has a lower full application cost, and can complete the packaging and transfer operation of the Mini/Micro-LED die 300 with higher yield and high efficiency.

It should be noted that the terms used herein are merely used for describing the specific embodiments, but are not intended to limit the exemplary embodiments of the present disclosure. As used herein, the singular forms are intended to include the plural forms as well, unless the context clearly indicates otherwise, and also, it should be understood that when the terms "include" and/or "comprise" are used in this specification, they indicate that there are features, steps, operations, devices, elements, and/or combinations thereof.

Unless otherwise specified, the relative arrangement, numerical expressions and numerical values of components and steps set forth in these examples do not limit the scope of the present disclosure. Meanwhile, it should be understood that for ease of description, each portion in the accompanying drawings is not necessarily drawn to the actual scale. The technologies, methods, and equipment known to those of ordinary skill in the art may not be discussed in detail, but where appropriate, the technologies, methods, and equipment should be regarded as part of the authorized specification. In all examples shown and discussed herein, any specific value should be interpreted as merely exemplary, rather than restrictive. Therefore, other examples of the exemplary examples may have different values. It should be noted that similar reference signs and letters represent similar items in the accompanying drawings below. Therefore, once an item is defined in one drawing, it does not need to be further discussed in subsequent drawings.

It should be understood that, in the description of the present disclosure, terms such as "front", "rear", "upper", "lower", "left", "right", "transverse", "longitudinal", "vertical", "horizontal", "top" and "bottom" indicate orientation or position relationships based on the accompanying drawings. Unless otherwise specified, these terms are merely intended to facilitate or simplify the description of the present disclosure, rather than to indicate or imply that the mentioned device or components must have a specific orientation and must be constructed and operated in a specific orientation. Therefore, they should not be construed as a limitation to the protection scope of the present disclosure. The orientation terms "inner" and "outer" refer to the inner and outer parts relative to the contour of the mentioned component.

For ease of description, spatially relative terms, such as "above", "on the upper side of", "on the upper surface of" and "on", can be used to describe the spatial positional relationship between components or features shown in the figure. It should be understood that the spatially relative terms are intended to encompass different orientations of the components in use or operation in addition to those shown in the figure. For example, if a component in the figure is inverted, it is described as a component "above other component or structure" or "on other component or structure". Therefore, the component will be positioned as "below other component or structure" or "under other component or structure". Therefore, the exemplary term "above" may include both orientations "above" and "below". The component may also be positioned in other different ways (rotated by 90 degrees or in other orientations), but the relative description of the space should be explained accordingly.

In addition, it needs to be noted that the use of such words as "first" and "second" to define components is merely intended to distinguish the corresponding components. Unless otherwise stated, such words have no special meaning and thus cannot be construed as limiting the protection scope of the present disclosure.

It should be noted that the terms "first", "second", and so on in the description and claims of this application and in the above accompanying drawings are intended to distinguish between similar objects but do not necessarily indicate a specific order or sequence. It should be understood that the data used in such a way may be exchanged under proper conditions to make it possible to implement the described examples of this application in sequences except those illustrated or described herein.

The technical principles of the present disclosure are described above with reference to the specific embodiments. These descriptions are merely intended to explain the principles of the present disclosure, and may not be construed as limiting the protection scope of the present disclosure in any way. Therefore, those skilled in the art may derive other specific implementations of the present disclosure without creative effort, but these implementations should fall within the protection scope of the present disclosure.

What is claimed is:

1. A flexure-based continuous ejector pin mechanism for chip mass transfer, comprising a thorn die attach unit, wherein the thorn die attach unit comprises a first drive frame, a second drive frame, a mounting base, a first thorn die attach drive device, a second thorn die attach drive device, first flexible hinges, second flexible hinges, and a pricking pin;

both the first drive frame and the second drive frame are of rectangular frame structures, and are arranged in a coplanar manner; the second drive frame is located on inside the first drive frame, and four vertexes of the second drive frame are connected to the first drive frame along a vertical direction through the first flexible hinges;

a left side and a right side of the mounting base are respectively connected to a left side and a right side of the second drive frame along a horizontal direction through the second flexible hinges;

the pricking pin is provided at a bottom of the mounting base along the vertical direction, an upper end of the pricking pin is fixedly connected to the bottom of the mounting base, and a lower end of the pricking pin extends below the first drive frame; and the first thorn die attach drive device is fixedly mounted on the first drive frame, and a drive end of the first thorn die attach drive device is in transmission connection to the second drive frame, such that the second drive frame can move horizontally under driving of the first thorn die attach drive device; and the second thorn die attach drive device is fixedly mounted on the second drive frame, and a drive end of the second thorn die attach drive device is in transmission connection to the second drive frame, such that the second drive frame can move vertically under driving of the second thorn die attach drive device.

2. The flexure-based continuous ejector pin mechanism according to claim 1, wherein the first thorn die attach drive device is fixedly mounted on a left side of the first drive frame, the drive end of the first thorn die attach drive device is arranged horizontally, and a drive direction of the first thorn die attach drive device and the second flexible hinge horizontally connected to the left side of the mounting base are arranged collinearly.

3. The flexure-based continuous ejector pin mechanism according to claim 1, wherein the second thorn die attach drive device is fixedly mounted on an upper side of the second drive frame, and a drive direction of the drive end of the second thorn die attach drive device is vertically arranged downward.

4. The flexure-based continuous ejector pin mechanism according to claim 1, wherein the four vertexes of the second drive frame are separately hinged to one of the first flexible hinges along the vertical direction; and the left side and the right side of the mounting base are each provided with two of the second flexible hinges for connection.

5. The flexure-based continuous ejector pin mechanism according to claim 1, wherein the first thorn die attach drive device and the second thorn die attach drive device are voice coil motors; and the first flexible hinges and the second flexible hinges are sheet structures made of aviation aluminum.

6. The flexure-based continuous ejector pin mechanism according to claim 1, further comprising: a portal frame, a first motion platform, a worktable, a second motion platform, and an industrial camera, wherein the first motion platform is configured to bear a circuit substrate;

the worktable is configured to heat and fix welding between an light-emitting diode (LED) die and the circuit substrate;

the second motion platform is configured to bear the LED die and move directly above the first motion platform;

the industrial camera is configured to detect opposite positions between the circuit substrate and each LED die;

the thorn die attach unit is configured to transfer the LED die on the second motion platform to the circuit substrate on the first motion platform;

the worktable is arranged on the first motion platform; and the portal frame is mounted directly above the first motion platform; and the industrial camera and the thorn die attach unit are mounted on the portal frame.

7. The flexure-based continuous ejector pin mechanism according to claim 6, further comprising a controller, wherein the controller is electrically connected to the first thorn die attach drive device, the second thorn die attach drive device, the first motion platform, the worktable, the second motion platform, and the industrial camera.

8. The flexure-based continuous ejector pin mechanism according to claim 6, wherein the LED die is a Mini-LED die or a Micro-LED die.

9. The flexure-based continuous ejector pin mechanism according to claim 7, wherein the controller is internally provided with a thorn die attach control method for transferring and packaging LED dies; and the thorn die attach control method comprises the following steps:

a loading operation: loading the circuit substrate to the worktable on the first motion platform, loading a die carrier with an LED die to a second transport platform, and moving, by the first motion platform, the circuit substrate into a welding region directly below the thorn die attach unit along an X direction;

an alignment operation: controlling, by the controller, the second motion platform to move along the X direction through detection information of the industrial camera, such that the LED die on the die carrier is aligned with the circuit substrate in the welding region;

a thorn die attach operation: controlling, by the controller, drive conditions of the first motion platform, the second motion platform, the first thorn die attach drive device, and the second thorn die attach drive device to the mounting base, such that the thorn die attach unit pricks off the LED die from the die carrier and transfers the LED die to a specified position on the circuit substrate; and a welding operation: controlling, by the controller, the worktable to heat and weld the LED die and the circuit substrate.

10. The flexure-based continuous ejector pin mechanism according to claim 9, wherein the thorn die attach operation specifically comprises the following steps:

controlling, by the controller, the first motion platform, the second motion platform, and the thorn die attach unit to move to the X direction at the same speed; and in a process of the thorn die attach unit moving to the X direction, controlling, by the controller, drive of the first thorn die attach drive device, such that the pricking pin reciprocates up and down along the vertical direction relative to the first drive frame at a set speed.

\* \* \* \* \*